(12) United States Patent
Lee et al.

(10) Patent No.: US 10,526,757 B2
(45) Date of Patent: Jan. 7, 2020

(54) LIGHT EMITTING SIGN APPARATUS USING OPTICAL FIBER

(71) Applicant: ALTECH CO., LTD., Daegu (KR)

(72) Inventors: Ki Hoon Lee, Daegu (KR); Sung Su Jo, Daegu (KR)

(73) Assignee: ALTECH CO., LTD., Daegu (KR)

( * ) Notice: Subject to any disclaimer, the term of this patent is extended or adjusted under 35 U.S.C. 154(b) by 0 days.

(21) Appl. No.: 16/018,962

(22) Filed: Jun. 26, 2018

(65) Prior Publication Data
US 2019/0048541 A1    Feb. 14, 2019

(30) Foreign Application Priority Data

Aug. 11, 2017    (KR) .................. 10-2017-0102474

(51) Int. Cl.
*H01L 31/053*    (2014.01)
*E01F 9/20*    (2016.01)
(Continued)

(52) U.S. Cl.
CPC ............... *E01F 9/20* (2016.02); *F21S 9/035* (2013.01); *F21V 5/007* (2013.01); *G02B 6/0006* (2013.01);
(Continued)

(58) Field of Classification Search
CPC ............. G09F 2009/3055; G09F 9/305; H01L 31/053–078
See application file for complete search history.

(56) References Cited

U.S. PATENT DOCUMENTS

| | | | |
|---|---|---|---|
| 6,198,872 B1* | 3/2001 | Lipson | G02B 6/25 362/555 |
| 2004/0213020 A1* | 10/2004 | Gotfried | G02B 6/0006 362/576 |

(Continued)

FOREIGN PATENT DOCUMENTS

| | | |
|---|---|---|
| CN | 202434162 U | 9/2012 |
| JP | 6-69985 U | 9/1994 |

(Continued)

OTHER PUBLICATIONS

International Search Report dated Jul. 6, 2018, with respect to International Application No. PCT/KR2017/011828, 3 pages.

(Continued)

*Primary Examiner* — Hang Lin
(74) *Attorney, Agent, or Firm* — Lewis Roca Rothgerber Christie LLP

(57) ABSTRACT

A light emitting sign apparatus using an optical fiber includes: a front panel including a plurality of emission holes; a plurality of optical fibers having one ends respectively connected to the plurality of emission holes and the other ends constituting a concentrated bundle; and a light source assembly including a plurality of light emitting diodes optically coupled to the other ends of the plurality of optical fibers, wherein the plurality of light emitting diodes are located on a plane. Each of the plurality of light emitting diodes belongs to any one of a plurality of groups, one ends of the plurality of groups are connected to the same node, and different power voltages are applied to the other ends of the plurality of groups.

14 Claims, 9 Drawing Sheets

(51) Int. Cl.

| | |
|---|---|
| *F21V 8/00* | (2006.01) |
| *F21V 5/00* | (2018.01) |
| *F21S 9/03* | (2006.01) |
| *H05B 33/08* | (2006.01) |
| *H02J 7/35* | (2006.01) |
| *H02J 7/00* | (2006.01) |
| *G09G 3/14* | (2006.01) |
| *G09F 13/00* | (2006.01) |
| *G09F 9/305* | (2006.01) |
| *G09F 9/33* | (2006.01) |
| *F21Y 105/12* | (2016.01) |
| *F21Y 115/10* | (2016.01) |
| *F21W 111/02* | (2006.01) |

(52) U.S. Cl.
 CPC ............ *G02B 6/0008* (2013.01); *G09F 9/305* (2013.01); *G09F 9/33* (2013.01); *G09F 13/005* (2013.01); *G09G 3/14* (2013.01); *H02J 7/0013* (2013.01); *H02J 7/35* (2013.01); *H05B 33/0803* (2013.01); *H05B 33/0857* (2013.01); *H05B 33/0884* (2013.01); *F21W 2111/02* (2013.01); *F21Y 2105/12* (2016.08); *F21Y 2115/10* (2016.08); *G09F 2009/3055* (2013.01); *G09G 2320/0626* (2013.01); *G09G 2370/022* (2013.01); *H01L 31/053* (2014.12)

(56) References Cited

U.S. PATENT DOCUMENTS

| | | | |
|---|---|---|---|
| 2005/0052883 A1* | 3/2005 | Qi ........................ | A47G 33/06 362/555 |
| 2008/0012125 A1* | 1/2008 | Son ...................... | H01L 25/167 257/724 |
| 2010/0219762 A1* | 9/2010 | Brumels ................ | F21S 8/086 315/158 |
| 2011/0121741 A1* | 5/2011 | Yamamoto ........... | G09G 3/3406 315/193 |
| 2011/0157880 A1* | 6/2011 | Chen .................... | F21S 9/037 362/183 |
| 2011/0241620 A1 | 10/2011 | Lin et al. | |
| 2012/0154427 A1 | 6/2012 | Sugiyama | |
| 2014/0286039 A1 | 9/2014 | Sigler | |
| 2017/0108189 A1 | 4/2017 | Yeh et al. | |
| 2019/0048541 A1 | 2/2019 | Lee et al. | |

FOREIGN PATENT DOCUMENTS

| | | |
|---|---|---|
| JP | 9-197987 A | 7/1997 |
| JP | 10-298935 A | 11/1998 |
| JP | 2010-61250 A | 3/2010 |
| JP | 2012-128209 A | 7/2012 |
| JP | 2013-31321 A | 2/2013 |
| JP | 2013-178740 A | 9/2013 |
| JP | 2013-236545 A | 11/2013 |
| JP | 2016-25688 A | 2/2016 |
| JP | 2017-76492 A | 4/2017 |
| JP | 2017-84397 A | 5/2017 |
| KR | 10-0612473 B1 | 8/2006 |
| KR | 10-0612474 B1 | 8/2006 |
| KR | 10-0612475 B1 | 8/2006 |
| KR | 10-0788986 B1 | 1/2008 |
| KR | 10-0934624 B1 | 1/2010 |
| KR | 10-2010-0026295 A | 3/2010 |
| KR | 10-0972039 B1 | 7/2010 |
| KR | 10-1077921 B1 | 10/2011 |
| KR | 10-1313317 B1 | 4/2013 |
| KR | 10-1324987 B1 | 11/2013 |
| KR | 10-1349203 B1 | 1/2014 |
| KR | 10-1469887 B1 | 12/2014 |
| KR | 10-1511049 B1 | 4/2015 |
| KR | 10-1547680 B1 | 9/2015 |
| KR | 10-2016-0094529 A | 8/2016 |
| KR | 10-1645349 B1 | 8/2016 |
| KR | 10-1743408 B1 | 6/2017 |
| KR | 10-1835819 B1 | 3/2018 |

OTHER PUBLICATIONS

Japanese Office Action dated Aug. 21, 2018, for corresponding Japanese Patent Application No. 2018-130873, 5 pages.
International Search Report dated Jun. 19, 2019 with respect to PCT Application No. PCT/KR2019/002979, 3 pages.
Japanese Office Action dated Jul. 30, 2019 with respect to Japanese Patent Application No. 2019-085752, 2 pages.
U.S. Office action dated Jun. 27, 2019, issued in U.S. Appl. No. 16/402,094 (15 pages).

* cited by examiner

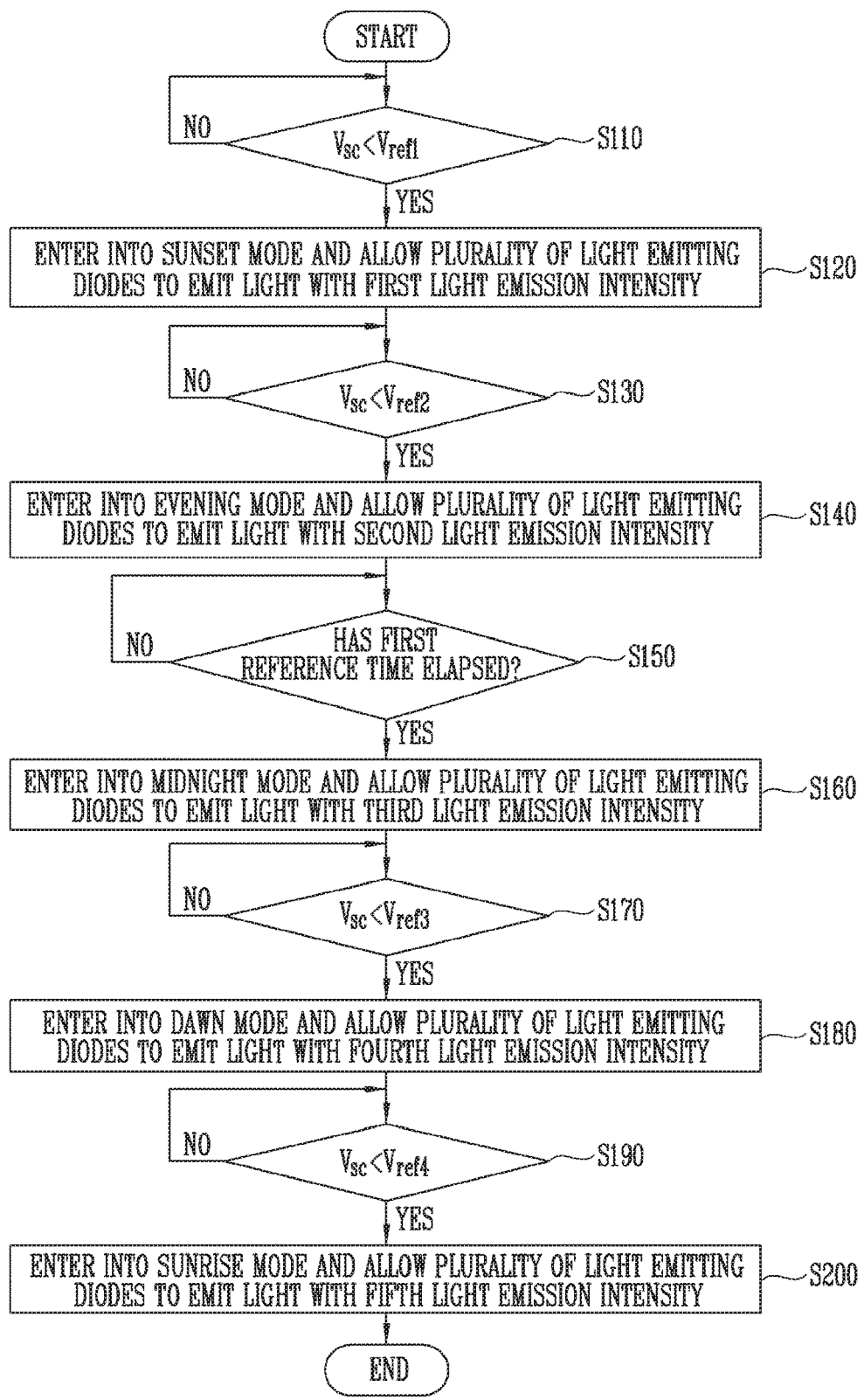

LIGHT EMITTING SIGN APPARATUS USING OPTICAL FIBER

CROSS-REFERENCE TO RELATED APPLICATION

The present application claims priority under 35 U.S.C. § 119(a) to Korean patent application 10-2017-0102474 filed on Aug. 11, 2017 in the Korean Intellectual Property Office, the entire disclosure of which is incorporated herein by reference.

BACKGROUND

1. Technical Field

The present disclosure generally relates to a light emitting sign apparatus using an optical fiber.

2. Related Art

In general, road sign and guide sign boards for allowing drivers to recognize directions of progress are installed on all roads such as city streets, national highways, and express highways. In particular, a large number of road sign and guide sign boards are installed at intersections and the like on complicated city streets to allow drivers to conveniently drive to their destinations while seeing them with the naked eyes.

The road sign and guide sign boards are various types of sign boards that guide drivers to their destinations and are installed on roads for the purpose of traffic safety. The specific shapes and standards of the road sign and guide sign boards, such as notice sign boards, restriction sign boards, indication sign boards, and subsidiary sign boards, are defined by laws and regulations. The road sign and guide sign boards are installed on not only roads on which vehicles travel but also sidewalks to allow pedestrians to conveniently and easily recognize directions of progress.

Such a road sign board is provided with a reflection paper used for retro-reflection on a board formed of an iron plate, etc. Accordingly, the road sign board provides information to a driver, etc. by reflecting light from a vehicle.

However, the reflection performance of the road sign board is remarkably deteriorated in a phenomenon in which dewdrops are formed on the road sign board due to atmospheric pressure in the occurrence of fog, on a rainy day, at night, or the like. Therefore, the road sign board using the reflection paper does not provide sufficient safety information to the driver, and accordingly, the risk of traffic accidents is increased.

Further, when the reflection paper cannot perfectly perform a reflection function since the lifespan of the reflection paper is shorter than the predicted lifespan, the risk of traffic accidents is considerably increased. When the reflection paper is exposed to ultraviolet light, the durability of the reflection paper is deteriorated, and therefore, the reflection performance of the reflection paper is remarkably deteriorated.

In particular, when the road sign board does not perform its original function in a danger area such as a sharp curve area on a road, a fatal accident frequently occurs. Therefore, the nation may be obligated to compensate an accident victim or insurance company.

In order to solve such problems, a light emitting sign board using an optical fiber has been developed. The light emitting sign board using the optical fiber has excellent durability. In addition, since the light emitting sign board using the optical fiber uses its own light source, the visibility of the light emitting sign board using the optical fiber is very satisfactory as compared with that of the road sign board using the reflection paper.

The conventional light emitting sign board using the optical fiber includes a group of light emitting diodes optically connected to the optical fiber. Referring to FIG. 1, the light emission of a group of light emitting diodes connected in series/parallel is generally controlled by one power voltage V1.

However, when a disconnection occurs due to damage of an arbitrary light emitting diode $D_1$, all light emitting diodes $D_2$ and $D_3$ connected in series to the damaged light emitting diode $D_1$ cannot be operated.

In addition, as current to flow through the light emitting diodes $D_1$, $D_2$, and $D_3$ that cannot be operated flows through other light emitting diodes $D_{other}$, the other light emitting diodes $D_{other}$ are consequently damaged due to transient current.

Also, the conventional light emitting sign board using the optical fiber according to FIG. 1 includes a resistor element for setting a voltage applied to each group of light emitting diodes connected in series. Therefore, unnecessary power is lost in the resistor element.

SUMMARY

Embodiments provide a light emitting sign apparatus using an optical fiber, which has excellent durability and visibility, and facilities expansion and control of functions.

According to an aspect of the present disclosure, there is provided a light emitting sign apparatus using an optical fiber, including: a front panel including a plurality of emission holes; a plurality of optical fibers having one ends respectively connected to the plurality of emission holes and the other ends constituting a concentrated bundle; and a light source assembly including a plurality of light emitting diodes optically coupled to the other ends of the plurality of optical fibers, wherein the plurality of light emitting diodes are located on a plane, wherein each of the plurality of light emitting diodes belongs to any one of a plurality of groups, one ends of the plurality of groups are connected to the same node, and different power voltages are applied to the other ends of the plurality of groups.

The light emitting sign apparatus may further include a lens layer including a plurality of lenses respectively covering the plurality of light emitting diodes in the light source assembly. The plurality of lenses respectively corresponding to the plurality of light emitting diodes may be designed such that the orientation angle of light emitted from the plurality of light emitting diodes is 45 degrees or less.

The plurality of groups may include a first group, a second group, and a third group. Light emitting diodes belonging to the first group may be located at the center on the plane, and light emitting diodes belonging to the second group and light emitting diodes belonging to the third group may be alternately located at the periphery on the plane.

The plurality of groups may include a first group, a second group, and a third group. Some of light emitting diodes belonging to the first group may be located at the center on the plane, the others of the light emitting diodes belonging to the first group, some of light emitting diodes belonging to the second group, and some of light emitting diodes belonging to the third group may be alternately located at the periphery on the plane, and a triangle formed by the others of the light emitting diodes belonging to the second group and an inverted triangle formed by the others of the light emitting diodes belonging to the third group may be located between the center and the periphery on the plane.

The light emitting sign apparatus may further include: a solar cell; a battery module including a first main battery and a second main battery; and a controller configured to charge the battery module with power generated from the solar cell, and drive the plurality of light emitting diodes by discharging the power stored in the battery module. The controller may alternately charge/discharge the first main battery and the second main battery with a first period.

The battery module may further include a first sub battery and a second sub battery. The controller may charge/discharge the first sub battery and the second sub battery with a second period such that discharge depths of the first sub battery and the second sub battery are maintained within a reference discharge depth range.

When any one of the first main battery and the second main battery satisfies a stop condition, the controller may drive the plurality of light emitting diodes by charging/discharging the other of the first main battery and the second main battery.

The first main battery, the second main battery, the first sub battery, and the second sub battery may be connected charge switches and discharge switches, respectively, a corresponding charge switch may be in an open state when a corresponding battery is not in a charge state, and a corresponding discharge switch may be in the open state when a corresponding battery is not in a discharge state.

The light emitting sign apparatus may further include: a solar cell; and a controller configured to drive the plurality of light emitting diodes, based on an output voltage of the solar cell. When the output voltage of the solar cell is decreased to less than a first reference voltage, the controller may enter into a sunset mode and allow the plurality of light emitting diodes to emit light with a first light emission intensity. When the output voltage of the solar cell is decreased to less than a second reference voltage, the controller may enter into an evening mode and allow the plurality of light emitting diodes to emit light with a second light emission intensity. When a first reference time elapses after the controller enters into the evening mode, regardless of the output voltage of the solar cell, the controller may enter into a midnight mode and allow the plurality of light emitting diodes to emit light with a third light emission intensity.

When the output voltage of the solar cell is increased exceeding a third reference voltage, the controller may enter into a dawn mode and allow the plurality of light emitting diodes to emit light with a fourth light emission intensity. When the output voltage of the solar cell is increased exceeding a fourth reference voltage, the controller may enter into a sunrise mode and allow the plurality of light emitting diodes to emit light with a fifth light emission intensity.

The light emitting sign apparatus may further include a controller configured to control the plurality of light emitting diodes according to a light emission mode. The controller may include N light emission control functions corresponding to N light emission modes in a software scheme. The controller generates M light emission modes that do not belong to the N light emission modes by combining the N light emission control functions. The N and M may be natural numbers.

The controller may communicate with a control server through a control communication module, and generate any one of the M light emission modes in response to an instruction of the control server.

The control server may instruct a plurality of light emitting sign apparatuses in a region adjacent thereto to equally generate a specific light emission mode among the M light emission modes.

The control server may update a light emission mode of the controller to generate a new light emission control function by changing a parameter of the light emission control function.

BRIEF DESCRIPTION OF THE DRAWINGS

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the exemplary embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 13 is a diagram illustrating control of the light emitting sign apparatus using the optical fiber according to an embodiment of the present disclosure.

DETAILED DESCRIPTION

Figure 1:
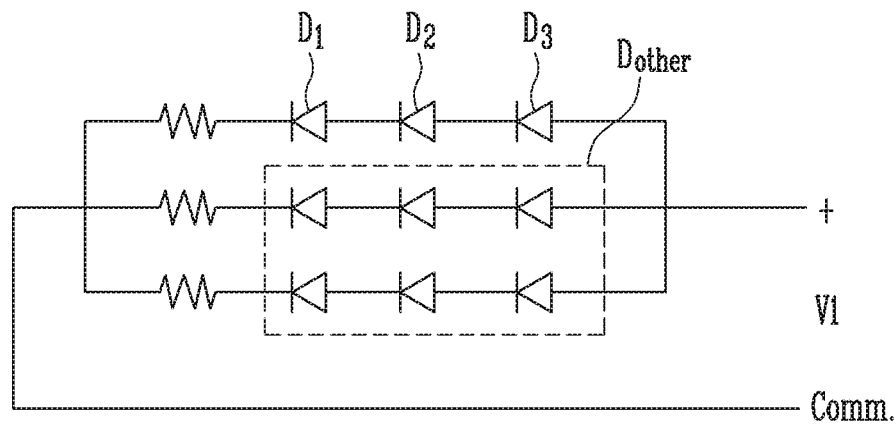
FIG. 1 is a diagram illustrating an electrical connection relationship of light emitting diodes in a light emitting sign board using an optical fiber according to a conventional art.

Hereinafter, exemplary embodiments are described in detail with reference to the accompanying drawings so that those skilled in the art may easily practice the present disclosure. The present disclosure may be implemented in various different forms and is not limited to the exemplary embodiments described in the present specification.

A part irrelevant to the description will be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and regions are exaggerated for clear expressions.

Figure 2:
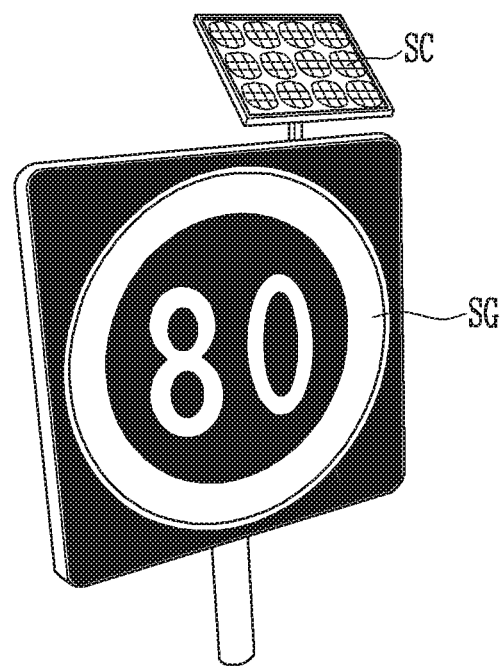
FIG. 2 is a diagram illustrating a light emitting sign apparatus using an optical fiber, which is viewed from a point of view, according to an embodiment of the present disclosure.
Figure 3:
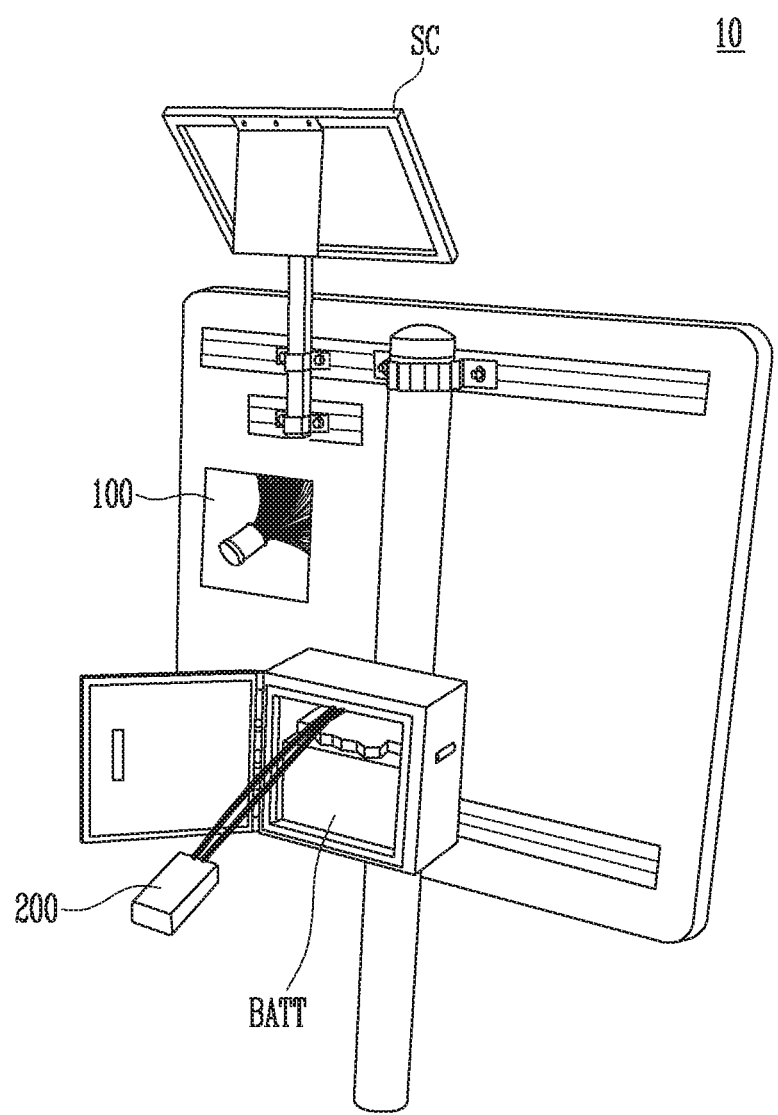
FIG. 3 is a diagram illustrating the light emitting sign apparatus using the optical fiber, which is viewed from another point of view, according to the embodiment of the present disclosure.

FIG. 2 is a diagram illustrating a light emitting sign apparatus using an optical fiber, which is viewed from a point of view, according to an embodiment of the present disclosure. FIG. 3 is a diagram illustrating the light emitting sign apparatus using the optical fiber, which is viewed from another point of view, according to the embodiment of the present disclosure.

Referring to FIGS. 2 and 3, the light emitting sign apparatus 10 using the optical fiber according to the embodiment of the present disclosure may include a front panel SG and a light source 100. The light source 100 will be described in more detail with reference to FIG. 4. In some embodiments, the light emitting sign apparatus 10 using the optical fiber may selectively further include a solar cell SC, a controller 200, and a battery module BATT.

For example, the controller 200 may operate such that power generated by the solar cell SC can be stored in the battery module BATT in the day time when the front panel SG can be easily viewed even though the front panel SG does not emit light.

For example, at night, the amount of power generated by the solar cell SC is rapidly lowered, and the visibility of the front panel SG is deteriorated. Therefore, the controller 200 allows the light source 200 to be properly operated using power stored in the battery module BATT, so that the front panel can emit light. A specific control example of this will be described later with reference to FIG. 9.

The front panel SG provides, on a plate, road information expressed by at least one of pictures, characters, numbers, and symbols, and the plate includes a plurality of emission holes corresponding to the road information. An optical fiber is connected to the emission hole, and light propagated through the optical fiber is emitted, so that the visibility of the front panel SG is improved. The optical fiber will be described later with reference to FIG. 4.

Figure 4:
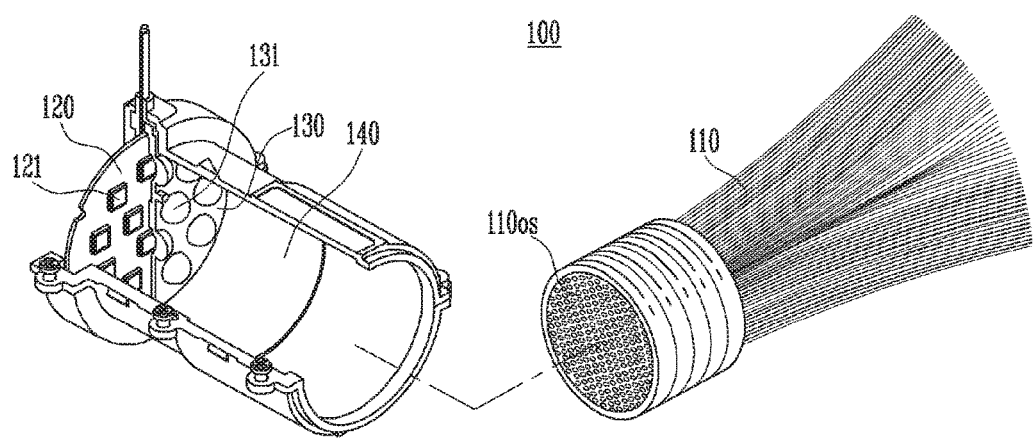
FIG. 4 is a diagram illustrating a light source according to an embodiment of the present disclosure.

FIG. 4 is a diagram illustrating a light source according to an embodiment of the present disclosure.

Referring to FIG. 4, the light source 100 according to the embodiment of the present disclosure may include a plurality of optical fibers 110 and a light source assembly 120. In some embodiments, the light source 100 may selectively further include a lens layer 130 and a barrel 140.

One ends of the plurality of optical fibers 110 may be connected to a plurality of optical fiber fixing parts corresponding to the plurality of emission holes of the front panel SG, respectively, and the other ends of the plurality of optical fibers 110 may constitute an optical fiber binding part 110os as a concentrated bundle. The optical fiber fixing part is a member that is fitted between a corresponding emission hole and one end of an optical fiber corresponding thereto, to fix the optical fiber to the emission hole. The number of optical fibers may correspond to that of emission holes of the front panel SG. The optical fiber binding part 110os may be fitted into the barrel 140.

The light source assembly 120 may include a plurality of light emitting diodes 121 optically coupled to the other ends of the plurality of optical fibers 110 through the optical fiber binding part 110os. The plurality of light emitting diodes 121 is located on a plane of the light source assembly 120. The plane may be a circular plane. The plane may be a substrate such as a PCB. Therefore, light emitted from the plurality of light emitting diodes 121 may be incident onto the other ends 110os of the plurality of optical fibers 110 and reach the emission holes of the front panel SG. The barrel 140 may be made of various materials such as metal and plastic. The barrel 140 may diffuse or reflect the light emitted from the plurality of light emitting diodes 121.

In an embodiment, the light emitting sign apparatus 10 using the optical fiber may further include the lens layer 130 including a plurality of lenses 131 covering a plurality of light emitting diodes corresponding thereto. The lens layer 130 may be made of various materials such as glass and plastic.

The barrel 140 includes the light source assembly 120 and the lens layer 130 therein, and the optical fiber binding part 110os may be fitted into the barrel 140.

The plurality of light emitting diodes 121 respectively corresponding to the plurality of lenses 131 may be designed such that the orientation angle of light emitted from the plurality of light emitting diodes 121 is 30 degrees to 45 degrees. That is, each of the plurality of lenses 131 is configured as a convex lens or the like, to concentrate the range of light emitted from the plurality of light emitting diodes 121. The orientation angle of the light emitted from the plurality of light emitting diodes 121 may be 30 degrees to 45 degrees.

In the conventional art, since a dip type light emitting diode is used as the light emitting diode, the lens layer capable of adjusting the orientation angle of light according to the embodiment of the present disclosure cannot be further included.

In a light emitting diode having the same lumen, when the orientation angle of light generated from the light emitting diode is 45 degrees, the brightness of the light is increased by about 141% as compared with that at an orientation angle of 60 degrees (see Equation 1).

$$\frac{\cos 45°}{\cos 60°} = \frac{\frac{1}{\sqrt{2}}}{\frac{1}{2}} \approx 1.414 \qquad \text{Equation 1}$$

When the orientation angle is narrowed, the brightness in the front direction is improved, but the uniformity of light incident into the optical fiber is lowered. In the embodiment of the present disclosure, although the light emitting diodes 121 are optimally concentrated and arranged, electrical groups of the light emitting diodes are set suitable for the concentration and arrangement so as to provide against damage of some light emitting diodes. Thus, the uniformity of light can be maximally maintained.

Physical and electrical arrangements of the plurality of light emitting diodes 121, which are derived through simulations of the inventors, will be described in detail later with reference to FIGS. 5 to 10.

In FIGS. 5 to 10, the plurality of light emitting diodes may belong to any one of a plurality of groups, one ends of the plurality of groups may be connected to the same node, and different power currents may be applied to the other ends of the plurality of groups.

In the embodiments of FIGS. 5 to 10, although the plurality of groups include a first group, a second group, and a third group, alternative embodiments involving a larger number of groups may be derived by otherwise simulating using the technical features of the present disclosure.

FIGS. 5 to 10 are diagram illustrating an electrical connection relationship of light emitting diodes and a physical arrangement relationship corresponding thereto in the light emitting sign apparatus using the optical fiber according to embodiments of the present disclosure.

Figure 5:
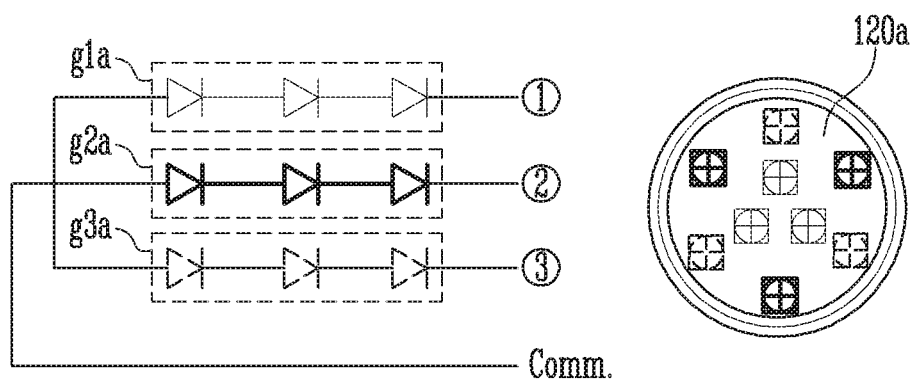
FIGS. 5 to 10 are diagrams illustrating an electrical connection relationship of light emitting diodes and a physical arrangement relationship corresponding thereto in the light emitting sign apparatus using the optical fiber according to embodiments of the present disclosure.

Referring to FIG. 5, each group includes three light emitting diodes connected in series.

Referring to FIG. 5, a plurality of light emitting diodes may belong to any one of a plurality of groups g1a, g2a, and g3a, one ends of the plurality of groups g1a, g2a, and g3a may be connected to the same node comm, and different power currents may be applied to the other ends of the plurality of groups g1a, g2a, and g3a. In the conventional art of FIG. 1, although light emitting diodes of any one group are damaged, current to flow through the damaged light emitting diodes is added to the other groups, and therefore transient current flows in the other groups. However, in the embodiment of the present disclosure, a power current designated by the controller 200 can be applied, and thus a target current can flow in each group.

Referring to FIG. 5, the plurality of groups g1a, g2a, and g3a may include a first group g1a, a second group g2a, and a third group g3a. The light emitting diodes belonging to the first group g1a may be located at the center on a plane 120a, and the light emitting diodes belonging to the second group g2a and the light emitting diodes belonging to the third group g3a may be alternately positioned at the periphery on the plane 120a. As described above, the light source assembly 120 includes a plurality of light emitting diodes positioned on the plane 120a. Thus, although the light emitting diodes of any one group do not emit light, the light emission uniformity of the front panel SG can be maximally maintained.

Figure 6:
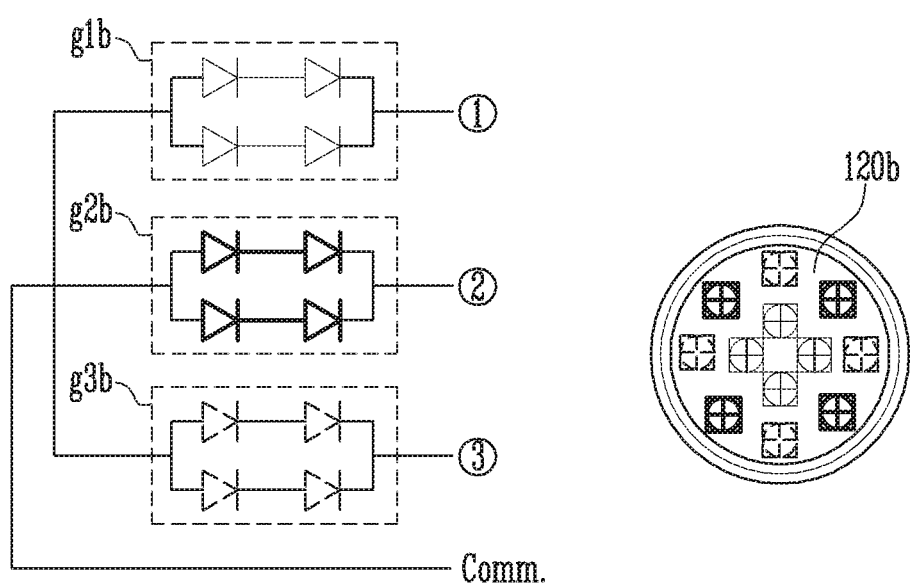

Referring to FIG. 6, each group includes four light emitting diodes connected in series/parallel.

Referring to FIG. 6, a plurality of light emitting diodes may belong to any one of a plurality of groups g1b, g2b, and g3b, one ends of the plurality of groups g1b, g2b, and g3b may be connected to the same node comm, and different power currents may be applied to the other ends of the plurality of groups g1b, g2b, and g3b. In the conventional art of FIG. 1, although light emitting diodes of any one group are damaged, current to flow through the damaged light emitting diodes is added to the other groups, and therefore transient current flows in the other groups. However, in the embodiment of the present disclosure, a power current designated by the controller 200 can be applied, and thus a target current can flow in each group.

Referring to FIG. 6, the plurality of groups g1b, g2b, and g3b may include a first group g1b, a second group g2b, and a third group g3b. The light emitting diodes belonging to the first group g1b may be located at the center on a plane 120b, and the light emitting diodes belonging to the second group g2b and the light emitting diodes belonging to the third group g3b may be alternately positioned at the periphery on the plane 120b. As described above, the light source assembly 120 includes a plurality of light emitting diodes positioned on the plane 120b. Thus, although the light emitting diodes of any one group do not emit light, the light emission uniformity of the front panel SG can be maximally maintained.

Figure 7:
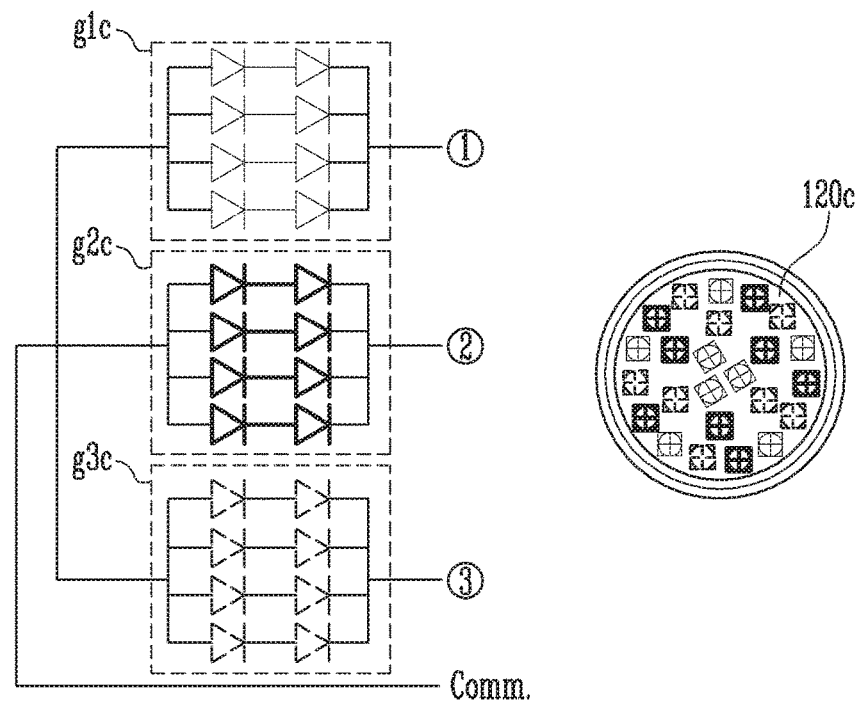

Referring to FIG. 7, each group includes eight light emitting diodes connected in series/parallel.

Referring to FIG. 7, a plurality of light emitting diodes may belong to any one of a plurality of groups g1c, g2c, and g3c, one ends of the plurality of groups g1c, g2c, and g3c may be connected to the same node comm, and different power currents may be applied to the other ends of the plurality of groups g1c, g2c, and g3c. In the conventional art of FIG. 1, although light emitting diodes of any one group are damaged, current to flow through the damaged light emitting diodes is added to the other groups, and therefore transient current flows in the other groups. However, in the embodiment of the present disclosure, a power current designated by the controller 200 can be applied, and thus a target current can flow in each group.

Referring to FIG. 7, the plurality of groups g1c, g2c, and g3c may include a first group g1c, a second group g2c, and a third group g3c. Some of the light emitting diodes belonging to the first group g1c may be located at the center on a plane 120c. The others of the light emitting diodes belonging to the first group g1c, some of the light emitting diodes belonging to the second group g2c, and some of the light emitting diodes belonging to the third group g3c may be alternately located at the periphery on the plane 120c. A triangle formed by the others of the light emitting diodes belonging to the second group g2c and an inverted triangle formed by the others of the light emitting diodes belonging to the third group g3c may be located between the center and the periphery on the plane 120c. As described above, the light source assembly 120 included a plurality of light emitting diodes located on the plane 120c. Thus, although the light emitting diodes of any one group do not emit light, the light emission uniformity of the front panel SG can be maximally maintained.

Figure 8:
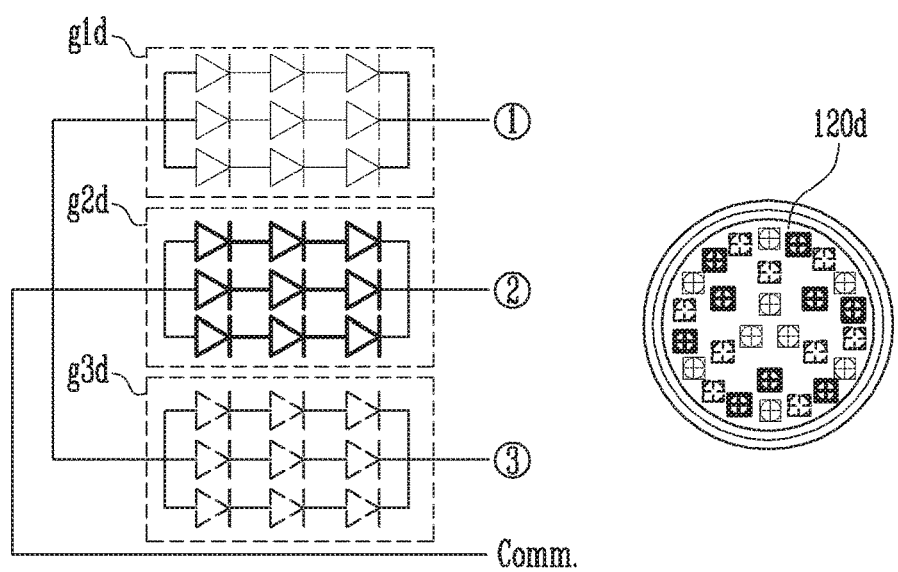

Referring to FIG. 8, each group includes nine light emitting diodes connected in series/parallel.

Referring to FIG. 8, a plurality of light emitting diodes may belong to any one of a plurality of groups g1d, g2d, and g3d, one ends of the plurality of groups g1d, g2d, and g3d may be connected to the same node comm, and different power currents may be applied to the other ends of the plurality of groups g1d, g2d, and g3d. In the conventional art of FIG. 1, although light emitting diodes of any one group are damaged, current to flow through the damaged light emitting diodes is added to the other groups, and therefore transient current flows in the other groups. However, in the embodiment of the present disclosure, a power current designated by the controller 200 can be applied, and thus a target current can flow in each group.

Referring to FIG. 8, the plurality of groups g1d, g2d, and g3d may include a first group g1d, a second group g2d, and a third group g3d. Some of the light emitting diodes belonging to the first group g1d may be located at the center on a plane 120d. The others of the light emitting diodes belonging to the first group g1d, some of the light emitting diodes belonging to the second group g2d, and some of the light emitting diodes belonging to the third group g3d may be alternately located at the periphery on the plane 120d. A triangle formed by the others of the light emitting diodes belonging to the second group g2d and an inverted triangle formed by the others of the light emitting diodes belonging to the third group g3d may be located between the center and the periphery on the plane 120d. As described above, the light source assembly 120 included a plurality of light emitting diodes located on the plane 120d. Thus, although the light emitting diodes of any one group do not emit light, the light emission uniformity of the front panel SG can be maximally maintained.

Figure 9:
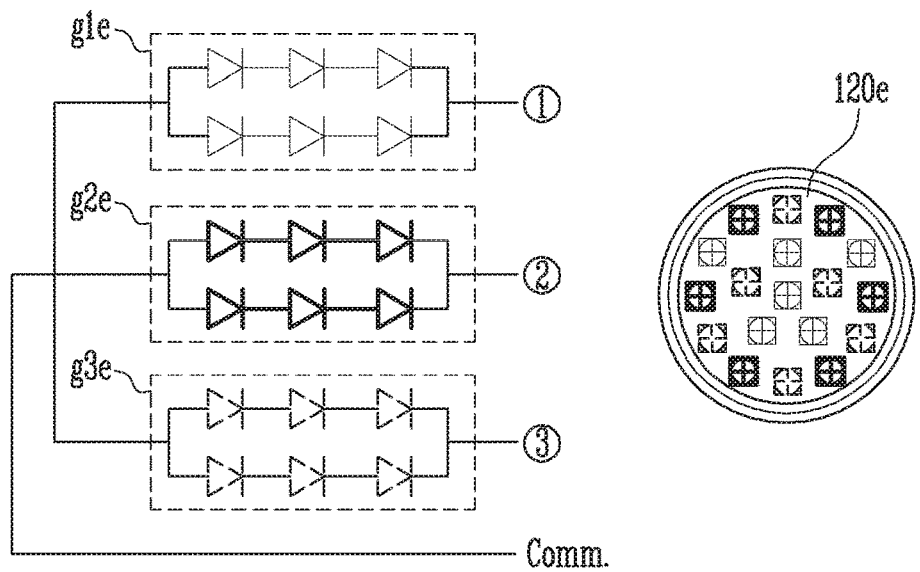

Referring to FIG. 9, each group includes six light emitting diodes connected in series/parallel.

Referring to FIG. 9, a plurality of light emitting diodes may belong to any one of a plurality of groups g1e, g2e, and g3e, one ends of the plurality of groups g1e, g2e, and g3e may be connected to the same node comm, and different power currents may be applied to the other ends of the plurality of groups g1e, g2e, and g3e. In the conventional art of FIG. 1, although light emitting diodes of any one group are damaged, current to flow through the damaged light emitting diodes is added to the other groups, and therefore transient current flows in the other groups. However, in the embodiment of the present disclosure, a power current designated by the controller 200 can be applied, and thus a target current can flow in each group.

Referring to FIG. 9, the plurality of groups g1e, g2e, and g3e include a first group g1e, a second group g2e, and a third group g3e. The light emitting diodes belonging to the first group g1e may be arranged in a W shape on a plane 120e. The light emitting diodes belonging to the second group g2e may be arranged at the periphery on the plane 120e with the light emitting diodes of the other groups, which are alternately interposed therebetween. The light emitting diodes belonging to the third group g3e may be arranged in a tree shape on the plane 120e. As described above, the light source assembly 120 includes a plurality of light emitting diodes located on the plane 120e. Thus, although the light emitting diodes of any one group do not emit light, the light emission uniformity of the front panel SG can be maximally maintained.

Figure 10:
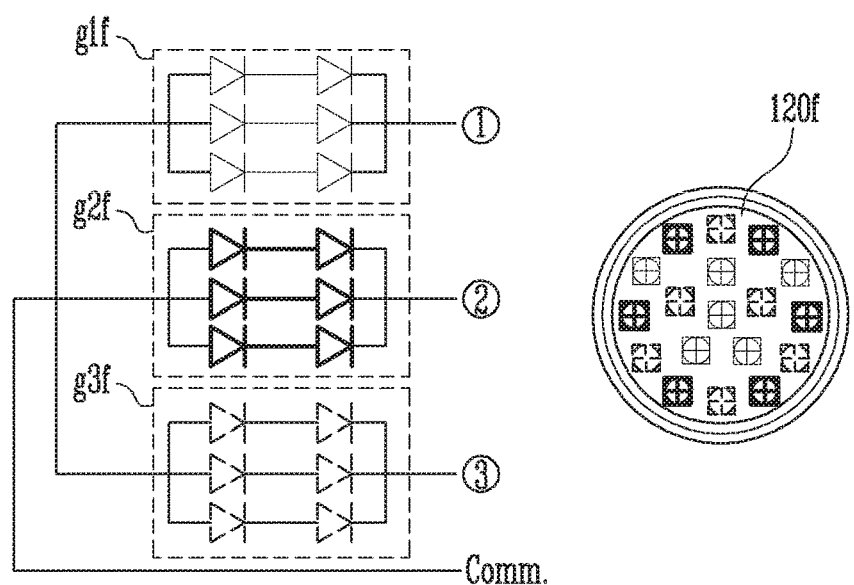

Referring to FIG. 10, each group includes six light emitting diodes connected in series/parallel.

Referring to FIG. 10, a plurality of light emitting diodes may belong to any one of a plurality of groups g1f, g2f, and g3f, one ends of the plurality of groups g1f, g2f, and g3f may be connected to the same node comm, and different power currents may be applied to the other ends of the plurality of groups g1f, g2f, and g3f. In the conventional art of FIG. 1, although light emitting diodes of any one group are damaged, current to flow through the damaged light emitting diodes is added to the other groups, and therefore transient current flows in the other groups. However, in the embodiment of the present disclosure, a power current designated by the controller 200 can be applied, and thus a target current can flow in each group.

Referring to FIG. 10, the plurality of groups g1f, g2f, and g3f include a first group g1f, a second group g2f, and a third group g3f. The light emitting diodes belonging to the first group g1e may be arranged in a W shape on the plane 120f. The light emitting diodes belonging to the second group g2f may be arranged at the periphery on the plane 120f with the light emitting diodes of the other groups, which are alternately interposed therebetween. The light emitting diodes belonging to the third group g3f may be arranged in a tree shape on the plane 120f. As described above, the light source assembly 120 includes a plurality of light emitting diodes located on the plane 120f. Thus, although the light emitting diodes of any one group do not emit light, the light emission uniformity of the front panel SG can be maximally maintained.

For example, in the embodiments of FIGS. 5 to 10, the configuration in which three light emitting diodes are connected in series is the configuration of a red or yellow light emitting diode having a typical voltage characteristic of about 2V, and power having a voltage of about 6V may be supplied. The configuration in which two light emitting diodes are connected in series is the configuration of a white or blue light emitting diode having a typical voltage characteristic of about 3V, and power having a voltage of about 6V may be supplied.

In order to perform the above-described function, the controller 200 may include a separate power sensing unit for detecting power characteristics of each group. The power sensing unit may include a sensor for sensing power (current or voltage) supplied to light emitting diodes.

Figure 11:
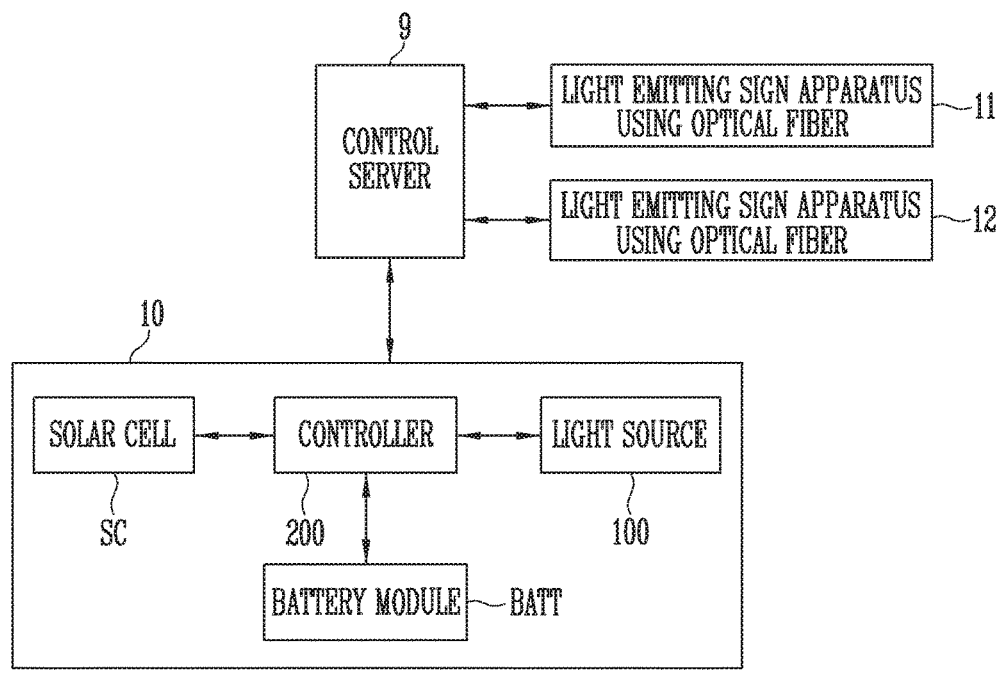
FIG. 11 is a diagram a relationship, etc. of the light emitting sign apparatus using the optical fiber and a control server according to an embodiment of the present disclosure.
Figure 12:
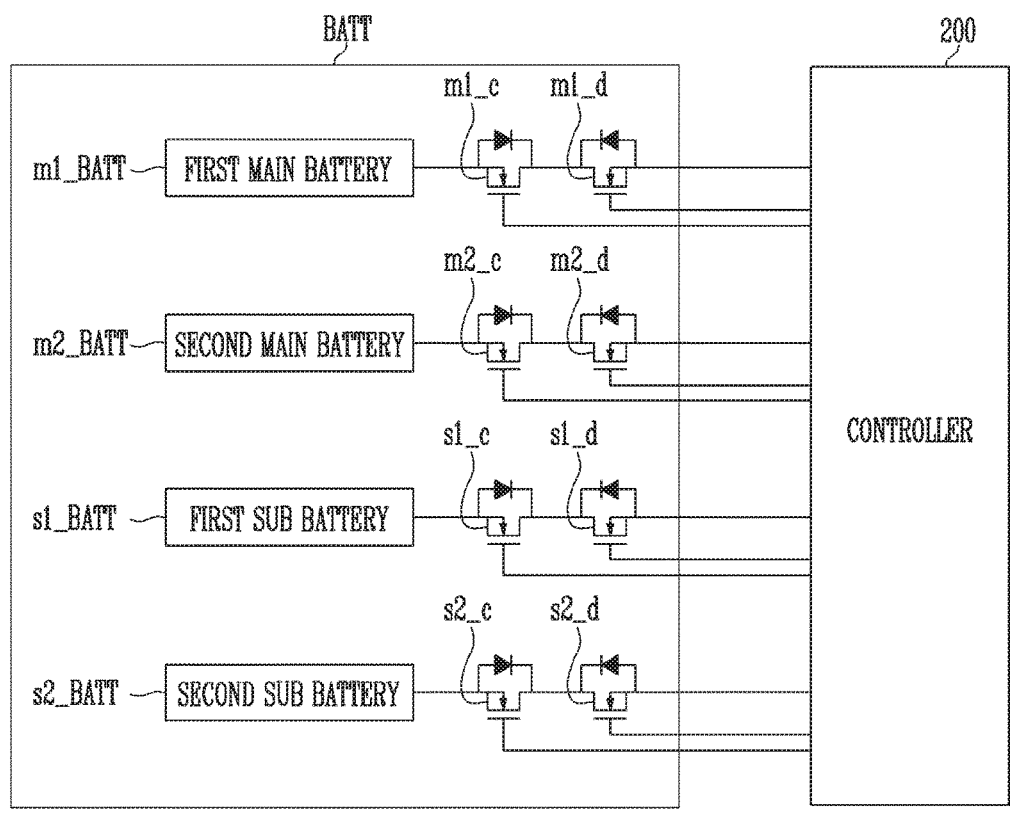
FIG. 12 is a diagram illustrating a battery module and a controller according to an embodiment of the present disclosure.

FIG. 11 is a diagram illustrating a relationship, etc. of the light emitting sign apparatus using the optical fiber and a control server according to an embodiment of the present disclosure. FIG. 12 is a diagram illustrating a battery module and a controller according to an embodiment of the present disclosure.

Referring to FIG. 11, the light emitting sign apparatus using the optical fiber according to the embodiment of the present disclosure may communicate with a control server 9 and other light emitting sign apparatuses 11 and 12.

The controller 200 may control a plurality of light emitting diodes according to a light emission mode.

The controller 200 may include N light emission control functions corresponding to N light emission modes in a software scheme. The controller 200 may generate M light emission modes that do not belong to the N light emission modes by combining the N light emission control functions.

For example, the controller 200 may be a micro controller unit (MCU) having block type functions built therein. All lighting modes (light emission modes) in which a light emitting sign board can be driven are built in a structure of block type functions in a program area of a built-in memory of the MCU when products are released to the market, and therefore, a firmware program may be designed such that a light emission mode can be diversified through combination and calling between the functions. As for the existing products, each product has built-in firmware defined for each lighting mode. Therefore, when a lighting mode is changed, the lighting mode is to be changed by being again downloaded to the MCU, which is inconvenient. According to the embodiment of the present disclosure, when products are released to the market, all possible lighting modes are built in a structure of block type functions in the built-in memory of the MCU, so that an operation mode transmitted through a communication signal from an external environment can be determined through combination and replacement of the built-in functions. Further, when products are released, only an integrated program is built in without distinguishing firmware for each product, so that the efficiency in product management can be improved.

In some embodiments, the controller 200 may communicate with the control server 9, and generate any one of the M light emission modes in response to an instruction of the control sever 9. In some embodiments, the control server 9 may instruct a plurality of light emitting sign apparatuses 11 and 12 in a region adjacent thereto to equally generate a specific light emission mode among the M light emission modes.

For example, there may be configured an integrated control system for controlling, in a lump, lighting modes of all light emitting sign boards installed in adjacent zones in which similar patterns are sensed by sharing and integrating environment change patterns of a corresponding region through a communication network. The integrated control system may be implemented using a low power wide area network (LPWAN). An operation function for each lighting mode is built in advance in a memory of the MCU, so that a lighting mode can be automatically changed in response to an external environment. The MCU may change the lighting mode with a small-sized data signal received through the LPWAN. The MCU has, in advance, a built-in algorithm for comparing and analyzing information sensed through sensors for each product and integrated information received through the LPWAN, so that the problem of malfunction can be minimized, which may occur due to an error or defect of the sensor. Accordingly, an optimal service and a high-durability product having long lifespan can be provided to users.

In an embodiment, the control server 9 may update a light emission mode of the controller 200 to generate a new light emission control function by changing a parameter of each light emission control function.

For example, although an integrated function block is built in the MCU, when another function is to be additionally implemented as time elapses, the control server 9 may be designed to remotely update the function block through the LPWAN. This enables a remote firmware update function that can be performed only in a high-performance MCU equipped with an operating system such as Linux to be performed even in a low-specification MCU such as Internet of Things. An input parameter of functional logic can be corrected through an algorithm for dividing and receiving low-capacity data periodically transmitted through the LPWAN and re-synthesizing the divided data, and accordingly, functions of the function block can be corrected and complemented.

Referring to FIG. 12, the battery module BATT may include a first main battery m1_BATT and a second main battery m2_BATT.

The controller 200 may drive a plurality of light emitting diodes by charging the battery module BATT with power generated from the solar cell SC and discharging the power stored in the battery module BATT.

The controller 200 may alternately charge/discharge the first main battery m1_BATT and the second main battery m2_BATT with a first period. In some embodiments, a plurality of battery operating systems may be introduced so as to extend the lifespan of the batteries. Two main batteries m1_BATT and m2_BATT, which form a pair, are alternately used, thereby extending a charging/discharging available period to be double. In addition, an over-charging prevention function, an over-discharging prevention function, and a cell balance function are performed through a dedicated protection circuit and a dedicated program, thereby optimizing the lifespan of the batteries. Further, a lithium-based batteries or capacitors, which have a long charging/discharging cycle and an excellent durability as compared with lead-acid batteries, are used as the main batteries m1_BATT and m2_BATT, so that a power storage system capable of stably supplying power for a long period of time can be designed.

For example, the first period may be one day. When the first main battery m1_BATT is charged in the daytime and is discharged at night, the second main battery m2_BATT may be charged in the following day time and be discharged at the following night.

In some embodiments, the battery module BATT may include a first sub battery s1_BATT and a second sub battery s2_BATT. The controller 200 may charge/discharge the first sub battery s1_BATT and the second sub battery s2_BATT in a second period such that discharge depths of the first sub battery s1_BATT and the second sub battery s2_BATT are maintained within a reference discharge depth range.

A charging/discharging operation for maintaining an active state is repeated with a second constant period, using two sub batteries s1_BATT and s2_BATT provided to achieve long preservation, so that the long preservation of the sub batteries is possible. For example, the reference discharge depth range may be 20% to 80%, and be preferably about 50%. The second period may have a unit of week. The second period may be set to one week or two weeks.

According to this embodiment, when the number of sunless days increases, the sub batteries s1_BATT and s2_BATT are used, thereby providing against an increase in the number of sunless days. This can solve the problem of battery voltage inequality due to local abrasion of polar plates, which occurs when the existing battery module BATT continuously charges/discharges only the main batteries m1_BATT and m2_BATT mainly used under a normal condition due to power constantly consumed in a day. In addition, power can be managed through an active combination of the batteries in time of emergency, so that the function of the light emitting sign apparatus can be continued even in the occurrence of abnormal climate.

In some embodiments, when any one of the first main battery m1_BATT and the second main battery m2_BATT satisfies a stop condition, the controller 200 may drive a plurality of light emitting diodes by charging/discharging the other of the first main battery m1_BATT and the second main battery m2_BATT. In some embodiments, when both of the first main battery m1_BATT and the second main battery m2_BATT satisfy the stop condition, the controller 200 may drive a plurality of light emitting diodes, using the first sub battery s1_BATT and the second sub battery s2_BATT.

Accordingly, a long preservation operating system of the sub batteries s1_BATT and s2_BATT may be introduced to provide against life shortening of the main batteries m1_BATT and m2_BATT. For example, a case where there may occur a phenomenon that the lifespan of the main batteries m1_BATT and m2_BATT is shortened since the residual amount of the main batteries m1_BATT and m2_BATT is smaller than a preset capacity may be set as the stop condition. Under the stop condition, the use of the main batteries m1_BATT and m2_BATT is temporarily stopped, and the system is operated using the sub batteries s1_BATT and s2_BATT, which may be repeatedly performed. In addition, when the stop condition is satisfied since the capacity of the first main battery m1_BATT being switched is smaller than the preset capacity due to discharge caused by a short circuit, etc. or since the first main battery m1_BATT is discharged due to a certain cause, the first main battery m1_BATT may be switched to the second main battery m2_BATT before the voltage of the first main battery m1_BATT reaches a preset termination voltage. In addition, when the same problem occurs in both of the main batteries m1_BATT and m2_BATT, the main batteries m1_BATT and m2_BATT may be switched to the sub batteries s1_BATT and s2_BATT as second power applying means. Thus, the lifespan of the main batteries m1_BATT and m2_BATT can be maximized, damage of the main batteries m1_BATT and m2_BATT can be prevented, and power can be continuously provided to the system. In the case of a lithium iron phosphate battery, the battery can be used up to a target lifespan cycle when the battery is charged to 80% and is discharged to 20%.

In some embodiments, the first main battery m1_BATT, the second main battery m2_BATT, a first sub battery s1_BATT, and second sub battery s2_BATT may be connected to charge switches m1_c, m2_c, s1_c, and s2_C and discharge switches m1_d, m2_d, s1_d, and s2_d, respectively. When a corresponding battery is not in a charge state, a corresponding charge switch may be in an open state. When a corresponding battery is not in a discharge state, a corresponding discharge switch may be in the open state.

All batteries separately have charge switches and discharge switches, respectively. When a battery is charged, only a corresponding charge switch is operated (turned on).

When a battery is discharged, only a corresponding discharge switch is operated (turned on), so that a short-circuit problem can be prevented. Further, all switches of an unused battery are open (turned off), so that the battery is in the open state, using only a standby current of 3 mA. Thus, the battery can maintain an active state in which the long preservation of the battery is possible.

In some embodiments, a 6V driving system may be introduced. In the light emitting sign apparatus, the reference voltage of the controller is set to 6V, so that various capacities of batteries can be designed, the lifespan of batteries can be maximized, and power consumption can be reduced. The existing product lighting a plurality of LEDs, such as a streetlamp, a light emitting sign using an optical fiber, or an internal illumination sign, drives using power of 12V or 24 or more according to the easiness of configuration thereof. In a circuit designed based on a 12V battery, a separate regulator for voltage drop is used to supply 3.3V that is a voltage used in the MCU. However, the MCU is operable when a battery voltage of 4.0V or more is supplied. Hence, although an LED light source for 12V is not driven, the MCU is continuously operated, and therefore, battery over-charging may be caused when the number of sunless days increases. On the other hand, in a circuit designed based on a 6V battery, a 3.3V regulator is used, but the MCU is operable only when a battery voltage of 4.0V or more is supplied. When the battery voltage is less than 4.0V, the MCU is automatically interrupted, so that unnecessary power consumption of the MCU is eliminated. Thus, the product can be automatically protected from battery over-discharging. A protection circuit is separately provided for each battery. However, when over-discharging is not interrupted due to a problem of the protection circuit itself, battery protection is possible by applying only a 6V battery, and thus a high-durability product having long lifespan can be provided.

FIG. 13 is a diagram illustrating control of the light emitting sign apparatus using the optical fiber according to an embodiment of the present disclosure.

Referring to FIG. 13, the controller 200 may drive the plurality of light emitting diodes 121, using an output voltage of the solar cell SC.

In an embodiment, when the output voltage of the solar cell SC is decreased to less than a first reference voltage $V_{ref1}$, the controller 200 may enter into a sunset mode and allow the plurality of light emitting diodes 121 to emit light with a first light emission intensity (S110 and S120). When the output voltage of the solar cell SC is decreased to less than a second reference voltage $V_{ref2}$, the controller 200 may enter into an evening mode and allow the plurality of light emitting diodes 121 to emit light with a second light emission intensity (S130 and 140). When a first reference time elapses after the controller 200 enters into the evening mode, regardless of the output voltage of the solar cell SC, the controller 200 may enter into a midnight mode and allow the plurality of light emitting diodes 121 to emit light with a third light emission intensity (S150 and S160).

The first reference voltage $V_{ref1}$ may be larger than the second reference voltage $V_{ref2}$, and the first light emission intensity may be larger than the second light emission intensity. That is, in this embodiment, the intensity of light emitted in the sunset is stronger than that of light emitted at the evening. This is because sign recognition in the sunset may be more difficult than that at the evening due to a backlight effect.

The first reference voltage $V_{ref1}$ may be about 10.5V, and the first light emission intensity may be a light emission intensity of 200%. The second reference voltage $V_{ref2}$ may be about 9.1V, and the second light emission intensity may be a light emission intensity of about 100%.

The first reference time may be about five hours, and the third light emission intensity may be smaller than the second light emission intensity. The third light emission intensity may be a light emission intensity of about 70%.

In an additional embodiment, when the output voltage of the solar cell SC is increased exceeding a third reference voltage $V_{ref3}$, the controller 200 may enter into a dawn mode and allow the plurality of light emitting diodes 121 to emit light with a fourth light emission intensity (S170 and S180). When the output voltage of the solar cell SC is increased exceeding a fourth reference voltage $V_{ref4}$, the controller 200 may enter into a sunrise mode and allow the plurality of light emitting diodes 121 to emit light with a fifth light emission intensity (S190 and S200).

The third reference voltage $V_{ref3}$ may be smaller than the fourth reference voltage $V_{ref4}$, and the fourth light emission intensity may be smaller than the fifth light emission intensity. That is, in this embodiment, the intensity of light emitted in the sunrise is stronger than that of light emitted at dawn. This is because sign recognition in the sunrise may be more difficult than that at dawn due to a backlight effect.

The third reference voltage $V_{ref3}$ may be about 2.5V, and the fourth light emission intensity may be a light emission intensity of 100%. The fourth reference voltage $V_{ref4}$ may be about 9.3V, and the fifth light emission intensity may be a light emission intensity of about 200%.

Under the condition in which strong light emission is performed in the sunrise or sunset, the plurality of light emitting diodes may be driven based on only the output voltage of the solar cell. However, under dimming control at midnight or dawn, the plurality of light emitting diodes may be driven based on a timer built in the MCU, which starts counting time from a specific voltage of the solar cell.

The above-described cycle may be a cycle of the main battery. When the main battery is driven for four days, the sub battery may be driven in the same cycle. Under a climate environment in which solar generation is normally performed, such as when the sub battery is driven for two days, the day required to drive the sub battery may be shorter than that required to drive main battery so as to manage the lifespan of the sub battery.

Under an abnormal climate environment in which the number of sunless days increases, when the main battery is over-discharged at night due to insufficient charge of the main battery, the main battery is automatically switched to the sub battery, so that the above-described cycle is continuously maintained.

According to the present disclosure, the light emitting sign apparatus using the optical fiber has excellent durability and visibility, and facilitates expansion and control of functions.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A light emitting sign apparatus using an optical fiber, comprising:
   a front panel including a plurality of emission holes;
   a plurality of optical fibers having one ends respectively connected to the plurality of emission holes and the other ends constituting a concentrated bundle;
   a light source assembly including a plurality of light emitting diodes optically coupled to the other ends of the plurality of optical fibers, wherein the plurality of light emitting diodes are located on a plane,
   a solar cell; and
   a controller configured to drive the plurality of light emitting diodes, based on an output voltage of the solar cell,
   wherein each of the plurality of light emitting diodes belongs to any one of a plurality of groups, each of the groups comprising two or more of the light emitting diodes connected in series, one ends of the plurality of groups are connected to the same node, and different power voltages are applied to the other ends of the plurality of groups,
   wherein the controller:
   when the output voltage of the solar cell is decreased to less than a first reference voltage, enters into a sunset mode and allows the plurality of light emitting diodes to emit light with a first light emission intensity;
   when the output voltage of the solar cell is decreased to less than a second reference voltage, enters into an evening mode and allows the plurality of light emitting diodes to emit light with a second light emission intensity; and
   when a first reference time elapses after the controller enters into the evening mode, regardless of the output voltage of the solar cell, enters into a midnight mode and allows the plurality of light emitting diodes to emit light with a third light emission intensity.

2. The light emitting sign apparatus of claim 1, further comprising a lens layer including a plurality of lenses respectively covering the plurality of light emitting diodes in the light source assembly,
   wherein the plurality of lenses respectively corresponding to the plurality of light emitting diodes are designed such that the orientation angle of light emitted from the plurality of light emitting diodes is 45 degrees or less.

3. The light emitting sign apparatus of claim 2, wherein the plurality of groups include a first group, a second group, and a third group,
   wherein light emitting diodes belonging to the first group are located at the center on the plane, and
   light emitting diodes belonging to the second group and light emitting diodes belonging to the third group are alternately located at the periphery on the plane.

4. The light emitting sign apparatus of claim 2, wherein the plurality of groups include a first group, a second group, and a third group,
   wherein some of light emitting diodes belonging to the first group are located at the center on the plane,
   the others of the light emitting diodes belonging to the first group, some of light emitting diodes belonging to the second group, and some of light emitting diodes belonging to the third group are alternately located at the periphery on the plane, and
   a triangle formed by the others of the light emitting diodes belonging to the second group and an inverted triangle formed by the others of the light emitting diodes belonging to the third group are located between the center and the periphery on the plane.

5. The light emitting sign apparatus of claim 1, further comprising:
   a battery module including a first main battery and a second main battery,
   wherein the controller is configured to charge the battery module with power generated from the solar cell, and drive the plurality of light emitting diodes by discharging the power stored in the battery module,
   wherein the controller alternately charges/discharges the first main battery and the second main battery with a first period.

6. The light emitting sign apparatus of claim 5, wherein the battery module further includes a first sub battery and a second sub battery,
   wherein the controller charges/discharges the first sub battery and the second sub battery with a second period such that discharge depths of the first sub battery and the second sub battery are maintained within a reference discharge depth range.

7. The light emitting sign apparatus of claim 6, wherein, when any one of the first main battery and the second main battery satisfies a stop condition, the controller drives the plurality of light emitting diodes by charging/discharging the other of the first main battery and the second main battery.

8. The light emitting sign apparatus of claim 6, wherein the first main battery, the second main battery, the first sub battery, and the second sub battery are connected charge switches and discharge switches, respectively,
   a corresponding charge switch is in an open state when a corresponding battery is not in a charge state, and
   a corresponding discharge switch is in the open state when a corresponding battery is not in a discharge state.

9. The light emitting sign apparatus of claim 1, wherein the controller:
   when the output voltage of the solar cell is increased exceeding a third reference voltage, enters into a dawn mode and allows the plurality of light emitting diodes to emit light with a fourth light emission intensity; and
   when the output voltage of the solar cell is increased exceeding a fourth reference voltage, enters into a sunrise mode and allows the plurality of light emitting diodes to emit light with a fifth light emission intensity.

10. The light emitting sign apparatus of claim 1, wherein the controller is configured to control the plurality of light emitting diodes according to a light emission mode,
    wherein the controller includes N light emission control functions corresponding to N light emission modes in a software scheme,
    wherein the controller generates M light emission modes that do not belong to the N light emission modes by combining the N light emission control functions,
    wherein the N and M are natural numbers greater than zero.

11. The light emitting sign apparatus of claim 10, wherein the controller communicates with a control server through a control communication module, and generates any one of the M light emission modes in response to an instruction of the control server.

12. The light emitting sign apparatus of claim 11, wherein the control server instructs a plurality of light emitting sign apparatuses in a region adjacent thereto to equally generate a specific light emission mode among the M light emission modes.

13. The light emitting sign apparatus of claim 11, wherein the control server updates a light emission mode of the controller to generate a new light emission control function by changing a parameter of the light emission control function.

14. The light emitting sign apparatus of claim 1, wherein the controller is configured to adjust different currents applied to each of the groups of the light emitting diodes in response to one or more of the groups of the light emitting diodes not functioning properly.

* * * * *